(12) United States Patent
Dudley

(10) Patent No.: US 7,265,966 B2
(45) Date of Patent: Sep. 4, 2007

(54) MODULAR HOUSING FOR ELECTRICAL INSTRUMENT AND MOUNTING MEMBER THEREFOR

(75) Inventor: Neil Frank Dudley, Chelmsford (GB)

(73) Assignee: Tyco Electronics UK Limited, Dorcan, Swindon (GB)

( * ) Notice: Subject to any disclaimer, the term of this patent is extended or adjusted under 35 U.S.C. 154(b) by 319 days.

(21) Appl. No.: 10/507,008

(22) PCT Filed: Mar. 13, 2003

(86) PCT No.: PCT/GB03/01060

§ 371 (c)(1),
(2), (4) Date: Sep. 7, 2004

(87) PCT Pub. No.: WO03/081262

PCT Pub. Date: Oct. 2, 2003

(65) Prior Publication Data

US 2005/0110481 A1    May 26, 2005

(30) Foreign Application Priority Data

Mar. 22, 2002 (GB) ................................ 0206887.2

(51) Int. Cl.
*H02B 1/00* (2006.01)
(52) U.S. Cl. .................. 361/659; 361/664; 361/665; 361/666
(58) Field of Classification Search ............... 361/659, 361/664–667
See application file for complete search history.

(56) References Cited

U.S. PATENT DOCUMENTS

| 4,121,147 | A |  | 10/1978 | Becker et al. |
| 5,473,504 | A |  | 12/1995 | Horan et al. |
| 5,602,363 | A | * | 2/1997 | Von Arx ..................... 174/559 |
| 5,966,010 | A |  | 10/1999 | Loy et al. |
| 6,563,697 | B1 | * | 5/2003 | Simbeck et al. ............ 361/668 |

FOREIGN PATENT DOCUMENTS

| DE | 91 09 176 U1 | 9/1991 |
| GB | 2356461 A | 11/1999 |
| WO | WO 00 08901 A | 2/2000 |

OTHER PUBLICATIONS

Great Britain Search Report dated Sep. 6, 2002 for GB 0206887.2.
International Preliminary Examination Report dated Jan. 12, 2004 for PCT/GB03/01060.
International Search Report dated Jul. 28, 2003 for PCT/GB03/01060.

* cited by examiner

*Primary Examiner*—Gregory D Thompson
(74) *Attorney, Agent, or Firm*—Myers Bigel Sibley & Sajovec, PA

(57) ABSTRACT

A modular housing for enclosing an electrical meter or metering type instrument is adapted for housing one of a plurality of modular type electrical meter or metering instruments, including instruments with or without a readable display. The housing includes at least one open end for receiving an instrument or instrument components and an interchangeable closure member for closing the open end. The closure member has a first connection means for interengagement with the open end of the housing and second connection means for mounting the instrument to a surface such as a wall or a connector rail, preferably a DIN rail. The housing may be used for surface, panel and rail mounted instruments of the same type.

16 Claims, 5 Drawing Sheets

MODULAR HOUSING FOR ELECTRICAL INSTRUMENT AND MOUNTING MEMBER THEREFOR

RELATED APPLICATIONS

The present application is a National Phase application of PCT/GB03/01060 filed on Mar. 13, 2003, and published in English, which claims priority from Great Britain Application No. 0206887.2 filed on Mar. 22, 2002, the disclosure of which is incorporated herein by reference.

BACKGROUND OF THE INVENTION

This invention relates to a modular housing for an electrical meter or metering type instrument, an electrical instrument comprising such a housing and a mounting member therefor. The invention particularly concerns an instrument housing adapted for housing one of a plurality of modular type electrical meter or metering instruments.

Electrical meter or metering instruments are usually provided with a display panel so that readings of the meter or metering instrument can be displayed either in analogue or digital form so that the readings can be read for monitoring recording or other purposes by users of equipment the instrument is being used for. Many meter or metering type instruments are panel mounted, that is to say the display panel at one end of the instrument is mounted in a correspondingly sized aperture in a panel in which several instruments may be mounted. In panel mounted arrangements the display panel is mounted substantially flush with the panel surface, with the main body of the instrument being concealed behind the panel and out of sight of the user. The instrument is typically mounted in a cantilever type manner with the instrument being supported in the aperture and secured to the panel in various ways.

There is an increasing demand for electrical meters or metering type instruments which are read remotely by a remote processor which may be located in a control centre up to 100 metres or more from the instrument. Instruments for this type of application can be designed without a readable display unit allowing cost savings to be made or offset against the additional costs of a communication interface and installation cabling. Typically, electrical meter or metering type instruments that do not have a display screen are mounted differently to the panel mounted instruments with a display. Instruments without a display are usually either surface mounted, including wall mounting, or mounted on a DIN rail in a cabinet.

Hitherto, it has been necessary for instrument manufacturers to design and develop separate ranges of electrical meters or metering type instruments for panel mounted applications, where a display is required, and surface or rail mounted applications where the display can be replaced with a communications interface. This has led to significantly different designs of electrical instruments, with few shared components, for each of the mounting methods concerned. A consequence of the different mounting methods described is that very few components can be shared often because the principle dimensions of the instruments is determined by the method of mounting that is employed. For example, panel mounted instruments have to conform to a standard shape and size so that they fit standard panel apertures, for instance 92 mm×92 mm for one particular standard. This results in different size and shaped housings for the instruments which prevents the use of common electrical components such as PCB's. The PCB's may contain the same discrete electrical components but the size and shape of the instrument determines that the fabrication of these components on the PCB and is usually different for each mounting application. This can have a significant impact on the cost of the instruments since lower production volumes can prevent economies of scale being made.

SUMMARY OF THE INVENTION

According to an aspect of the invention there is a modular housing for enclosing an electrical meter or metering type instrument; the said housing being adapted for housing one of a plurality of modular type electrical meter or metering instruments including instruments with or without a readable display, the housing comprising at least one open end for receiving one of the said instruments within the housing and connection means for connection with an interchangeable end closure member which, in a first configuration, comprises a transparent display panel for a readable display, and in a second configuration, a mounting plate for mounting the said instrument with respect to a surface or a connector rail.

The modular housing according to this aspect of the invention readily enables a single housing to be used for a range of instruments including panel mounted, rail mounted and surface mounted instruments with or without a readable display. This can significantly reduce manufacturing and other associated production costs since it enables sharing of components, including the housing and other electrical components such as PCB's, across a range of instruments. This modular approach to the design and manufacture of the instruments can result in 90% of the components of a particular instrument being shared across a range of products. For example, by replacing the display screen of a panel mounted instrument with an interchangeable end closure member comprising a mounting plate for mounting the instrument directly or indirectly to a surface or a connector rail the remaining components can be shared for surface mounted, rail mounted and panel mounted applications. This can result in significant cross savings since higher volume production volumes can be achieved for the shared components. The modular housing of this aspect of the invention readily provides for a modular range of instruments and this is not only advantageous in terms of production costs but also in terms of spare part inventories, maintenance of the range of modular products and therefore greater customer or end user satisfaction. The modular housing also provides commonality between the principle external dimensions for a particular range of instruments sharing a common housing. This has the advantage of enabling limited cabinet space to be maximised since each instrument from a range of instruments will occupy the same amount of space. This can also have the advantage that one instrument may be changed for another without having to rearrange the installation of a number of instruments within the cabinet.

Preferably, the said connection means comprises an interlocking engagement means capable of fixing the said interchangeable closure member to the said housing. The interlocking engagement of the connection means readily enables the closure member to be fixed to the modular housing to close the housing at the open end which would otherwise be closed by the transparent display panel in the panel mounted application. In this way the connection means readily enables the modular housing to be closed in a simple and cost effective manner.

In preferred embodiments the said connection means comprises part of an interlocking resilient clip arrangement. The clip may provide a snap-fit connection for closing the housing and additionally or alternatively may be provided with release means for releasing the inter engagement of the clip arrangement so that the closure member can be removed for maintenance or other purposes.

According to another aspect of the invention, there is also provided an electrical meter or metering instrument comprising a housing according to the aforementioned aspect of the invention. It will be appreciated that the instrument may comprise any electrical meter or metering type instrument including but not limited to analogue or digital type ammeters, voltmeters, wattmeters, varimeters, electrical energy usage meters including kilowatt hour meters and the like, electronic meter relays, phase sequence meters, for example. This aspect of the invention also contemplates electrical instruments which have a readable display and/or a communications interface for connection to a communication link for remote reading of the instrument. The electrical instrument may comprise any meter or metering type instrument which measures, monitors, records or responds to electrical parameter values.

According to a further aspect of the invention there is a modular housing for enclosing an electrical meter or metering type instrument; the said housing being adapted for housing one of a plurality of modular type electrical meter or metering instruments including instruments with or without a readable display, the housing having at least one open end for receiving one of the said instruments within the housing and an interchangeable closure member for closing the said open end, the closure member having first connection means for inter-engagement with the said open end and second connection means for mounting the said instrument to a surface or a connector rail.

Preferably, the said second connection means comprises a DIN rail connector. The DIN rail connector enables the housing and instrument contained therein to be mounted on a standard DIN rail as is commonly used for mounting electrical meter or metering type instruments in cabinets or the like. In this respect the closure member constitutes a mounting member or mounting plate which not only closes the modular housing containing the instrument but also provides a means for mounting the housing on a DIN rail. This minimises the number of components that are specific to the type of mounting since the closure member can readily incorporate the mounting for the housing of an instrument. In this respect it will be appreciated that all the components of a panel mounted instrument, less the display and display electronics, may be used in a DIN rail mounted instrument by replacing the display panel with an interchangeable end plate in the form of a closure member having a DIN rail connector.

Preferably, the said connection means comprises an elongate channel for engagement with part of a DIN rail and latching means for releasably connecting the said housing to the DIN rail. The channel readily enables the housing to be supported along its width from one side of the instrument to the other when mounted on the DIN rail, which mounting may result in the instrument being cantilevered from the DIN rail connector and therefore the channel readily enables the weight of the housing and instrument to be supported over a greater area. The latching means readily enables the housing and instrument to be releasably connected to the DIN rail so that the instrument can be easily installed and removed from the rail while forming a secure connection following installation.

In another embodiment, the said second connection means comprises fastening means for fixing the said closure member directly to a surface on which the instrument is to be mounted or to an surface mounting plate for indirect attachment to the said surface. In this way the closure member is provided with surface mounting means for either directly mounting the housing on a surface such as a wall or for mounting the closure member to a surface using an intermediate mounting plate. If an intermediate mounting plate is used the same closure member may be used for DIN rail mounting as surface mounting by providing further mounting means for fixing the closure member to a surface mounting end plate, for example. If a surface mounting end plate is used it is preferred that the mounting plate has dimensions greater than that of the closure member to enable the mounting plate to be easily mounted using mounting screws or the like around the periphery of the housing.

In a further aspect of the invention there is mounting member for mounting a modular housing of an electrical meter or metering type instrument; the said housing being adapted for housing one of a plurality of modular type electrical meter or metering instruments including instruments with or without a readable display, the said mounting member being adapted to close an open end of the said housing and having first connection means for inter-engagement with the said open end and second connection means for mounting the said instrument to a surface or a connector rail. The closure member according to this aspect of the invention can therefore be used for closing the open end of a modular housing according to the aforementioned aspects of the invention and for mounting the housing to either a surface a connector rail, preferably a DIN rail, or to both. It will be understood that the closure member is interchangeable so that different closure members having different mounting adaptations can be used according to the mounting application requirement.

BRIEF DESCRIPTION OF THE DRAWINGS

Various embodiments of the invention will now be more particularly described, by way of example, with reference to the accompanying drawings, in which.

DETAILED DESCRIPTION OF EMBODIMENTS OF THE INVENTION

Figure 1:
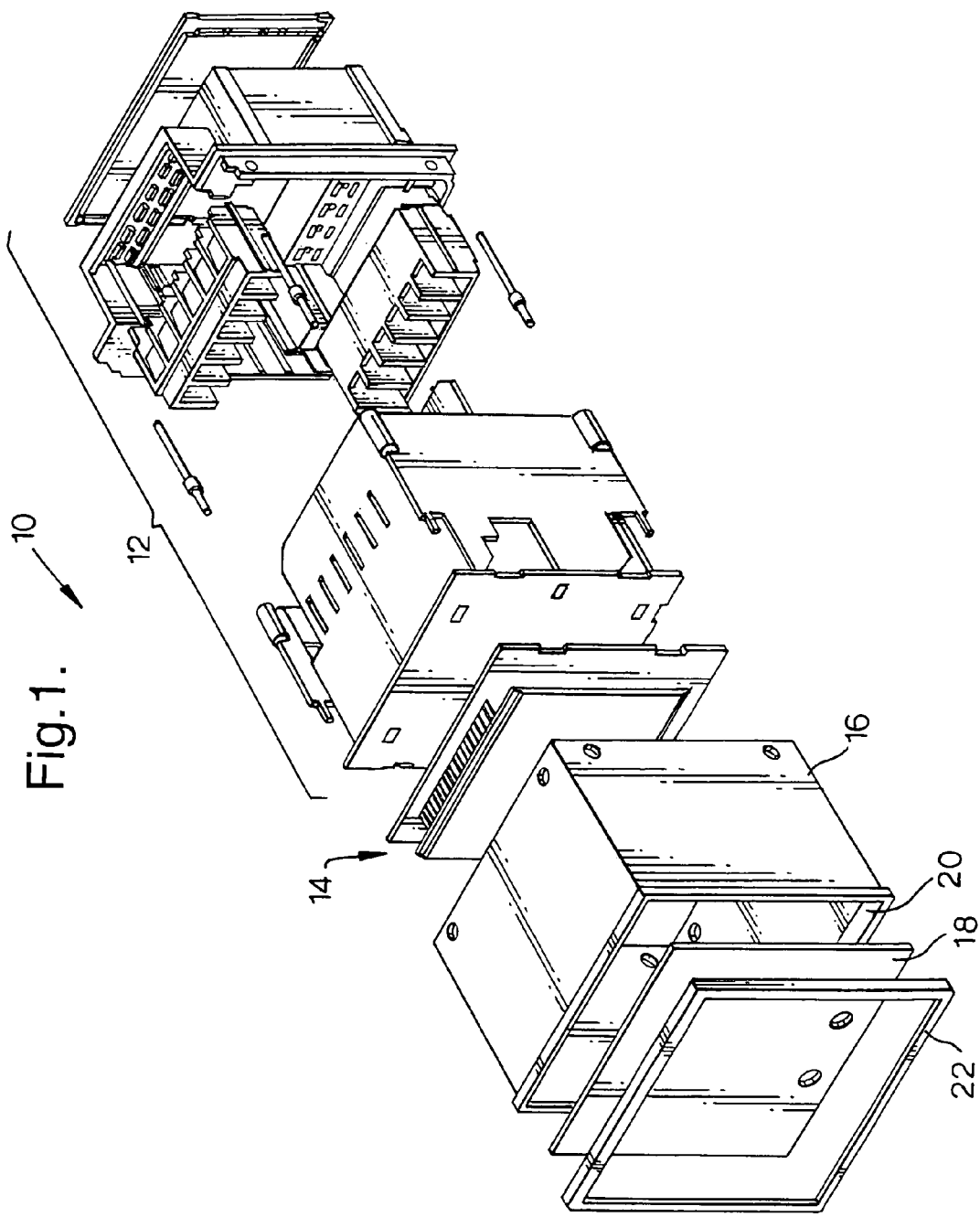
FIG. 1 is an exploded perspective view of an electrical meter or metering type instrument having a housing according to an arrangement of the present invention.

Referring to FIG. 1, a modular type electrical meter or metering instrument 10 comprises a plurality of electrical components 12 common to various instrument mounting configurations, for example panel mounting, surface mounting and rail mounting applications. The instrument shown in FIG. 1 is adapted for panel mounting and includes a readable display 14 which may be an LCD, LED or plasma screen display mounted on a PCB. The electrical components 12 and 14 are enclosed within a rectangular of square cross-section housing 16 which is closed at a front end thereof, to the left of the drawing in FIG. 1, by a glass or perspex transparent screen element 18 which locates in a recess 20 around the periphery of the housing 16 at the open end thereof. A frame element 22 sandwiches the screen 18 between the housing and the frame.

The housing 16 has standard dimensions for panel mounting applications and in this particular example the housing measures 92 mm×92 mm, although other standard and non-standard sizes of housing may be used.

Figure 2:
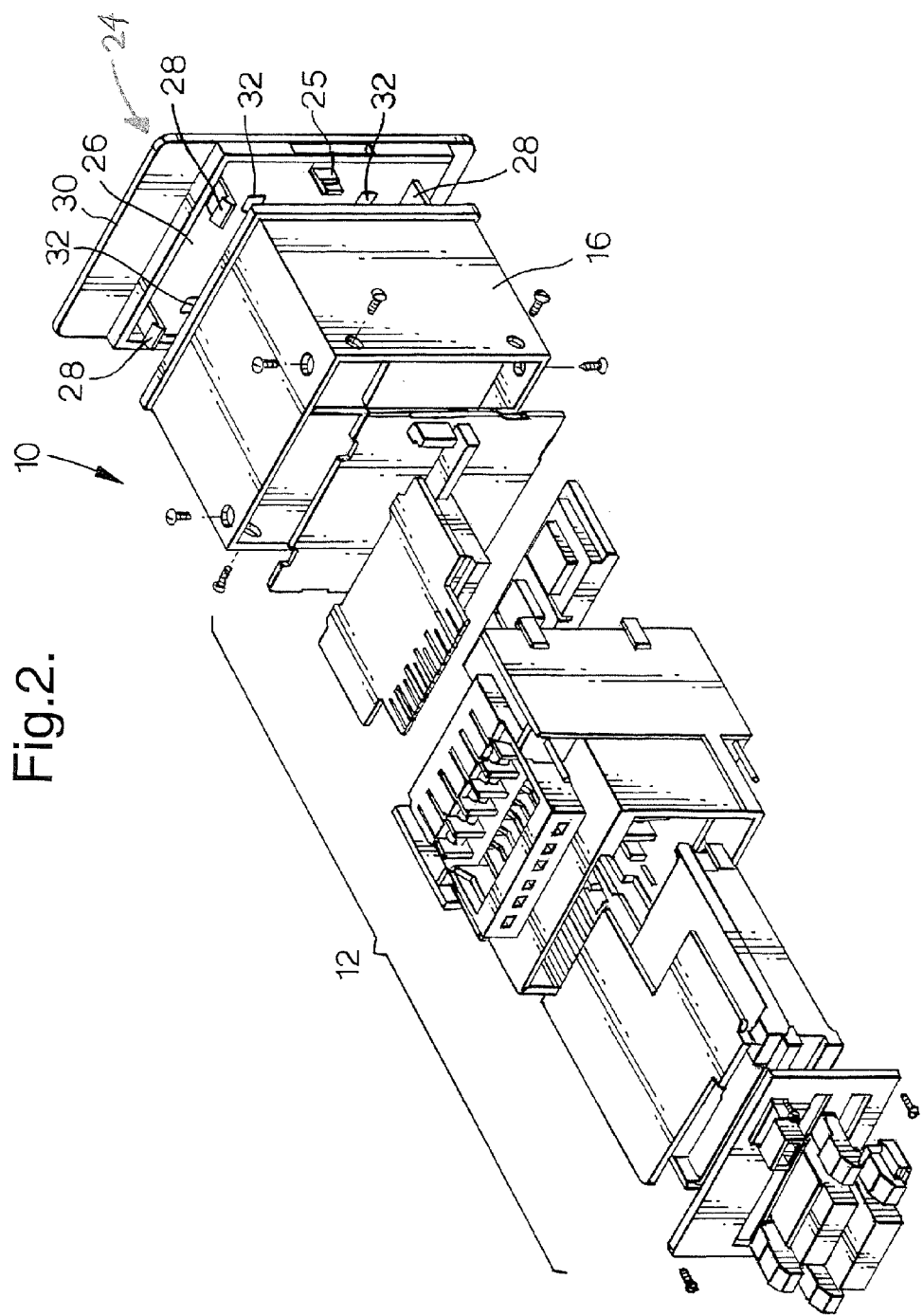
FIG. 2 is an exploded perspective view similar to that of FIG. 1 but with the instrument viewed in the opposite direction with the housing and a housing closure and mounting member positioned at the opposite to that of FIG. 1.

Referring to FIG. 2, which shows an electrical instrument similar to that of FIG. 1 but from the opposite end so that the electrical components 12 common to both instruments are shown to the left hand side of the drawing in FIG. 2 and the common modular housing 16 to the right hand side of the drawing. In this arrangement the display 14, screen 18 and frame 22 are not required and the open end of the housing closed by the screen 18 in the arrangement of FIG. 1 is closed by an interchangeable mounting panel generally indicated 24. The instrument of FIG. 2 is identical in every other respect to that of FIG. 1 except that instead of having a readable display the electrical parameter or parameters read, monitored or recorded by the instrument are transmitted on a communications link, for example a transmission line connected to a communications interface card in the instrument, to a remote location, for example a centralised control unit.

The interchangeable closure member 24 comprises a first end plate 26 which has dimensions substantially the same as that of the housing 16 so that it can close the end of the housing in the same way that the screen 18 closes the housing in FIG. 1. The surface of the closure element 26 includes a plurality of upstanding resilient interlocking engagement clips 25, 28 which extend perpendicularly from the surface of the closure member and are positioned inwards of the outer periphery so that they engage corresponding interlocking parts (not shown) on the inner surface of the housing 16 to form an interlocking engagement between the housing and the closure 26.

The closure member 26 can be used for either surface mounting the housing and instrument to a wall or other like surface or for mounting the instrument to a rail such as a standard DIN rail, as are commonly used for mounting such instruments in electrical cabinets and the like.

Prior to interengagement of the closure 26 with the housing 16 the closure can be secured to a surface mounting plate 30 by fastening means 32 which may comprise bolts, screws or other means. The surface mounting plate 30 is secured to the opposite side of the closure member 26 when it is required to provide a surface mount for the instrument 10.

The surface mounting plate 30 has at least one dimension greater than that of the closure member 26 so that it extends beyond the periphery of the closure member so that holes 34 can be provided in the protruding parts for fixing the mounting plate and hence instrument 10 to a surface.

In preferred embodiments the closure member 26 and mounting plate 30 are separate components, however the invention also contemplates embodiments in which the closure member 26 is integral with the mounting plate 30 so that fastening means 32 are not required. In the arrangement of FIG. 2 the closure member 26 can be used for both mounting the instrument on a standard DIN rail or for use in combination with the mounting plate 30 for surface mounting applications. This will become further apparent from the description that is to follow with reference to FIGS. 4 to 6.

Figure 3:
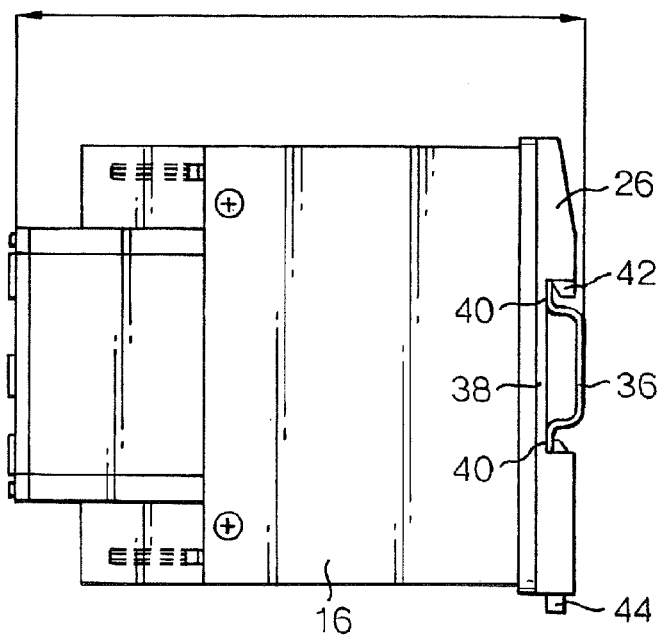
FIG. 3 is a side elevation view of the housing with a closure member according to one arrangement of the invention.

Referring to FIG. 3, which shows the instrument 10 with housing 16 having a closure member 26 mounting the instrument to a standard DIN rail 36. The rear surface of the closure member 26 as shown to the right of the drawing in FIG. 3, is provided with a generally U-shaped elongate channel 38 which extends from one side of the closure member to the other for receiving the DIN rail 36. As can be seen in the drawing the DIN channel has a "top hat" cross section which defines a pair of parallel lips 40 along the edges of the rail. One of the walls of the channel 38 is provided with an upstanding projection 42 for engagement with one of the lipped edges 40 for locating the rail 36 within the channel. The other side of the channel is provided with a latch or release clip 44 which is resiliently biased to engage the other lipped edge of the rail 36. In the engaged position shown in FIG. 3 the latch 44 prevents movement of the instrument 10 with respect to the rail when mounted.

Figure 4:
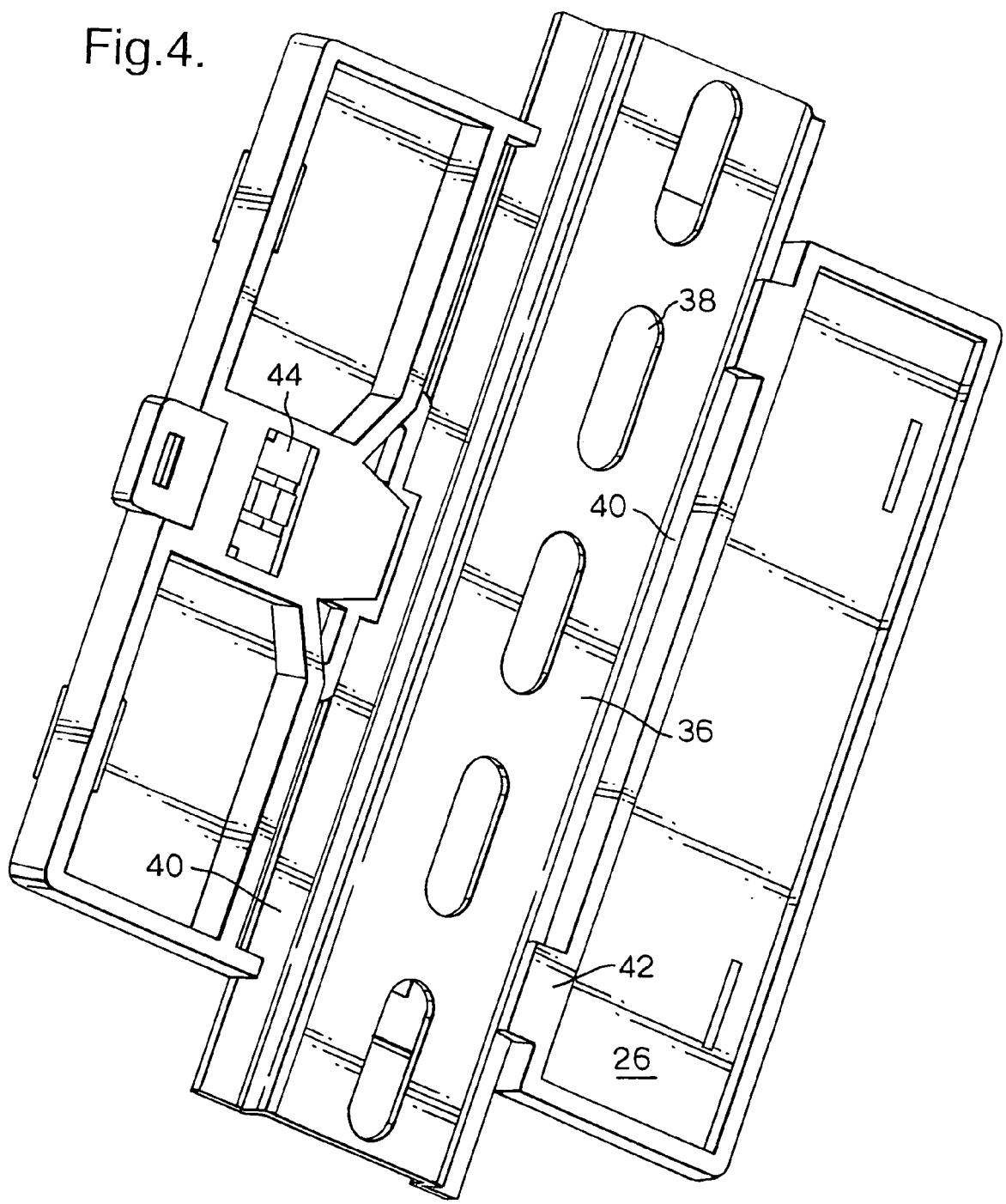
FIG. 4 is a perspective view of the housing closure member shown in FIGS. 2 and 3 on the side that is furthest from the housing when installed.

The reverse side or rail side of the closure member 26 described in FIGS. 2 and 3 can best be seen in the drawings of FIG. 4 which shows the rail 36 located in the channel 38 and secured thereto by the latch 44.

Figure 5:
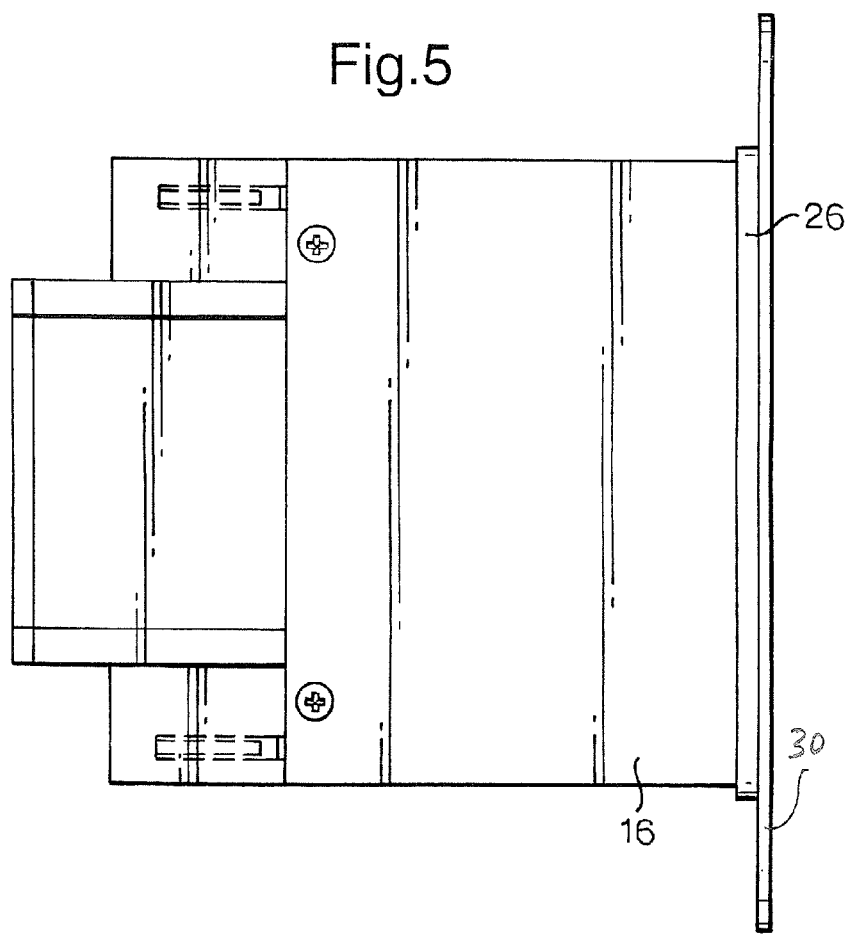
FIG. 5 is a side elevation view similar to that of FIG. 3 with a closure and mounting member according to a further arrangement of the present invention.

Referring now to FIG. 5, which shows the instrument assembled in the housing 16 closed by the closure member 26 and secured to a surface mounting plate 30 for attachment to a wall or other surface by screws or other means.

Figure 6:
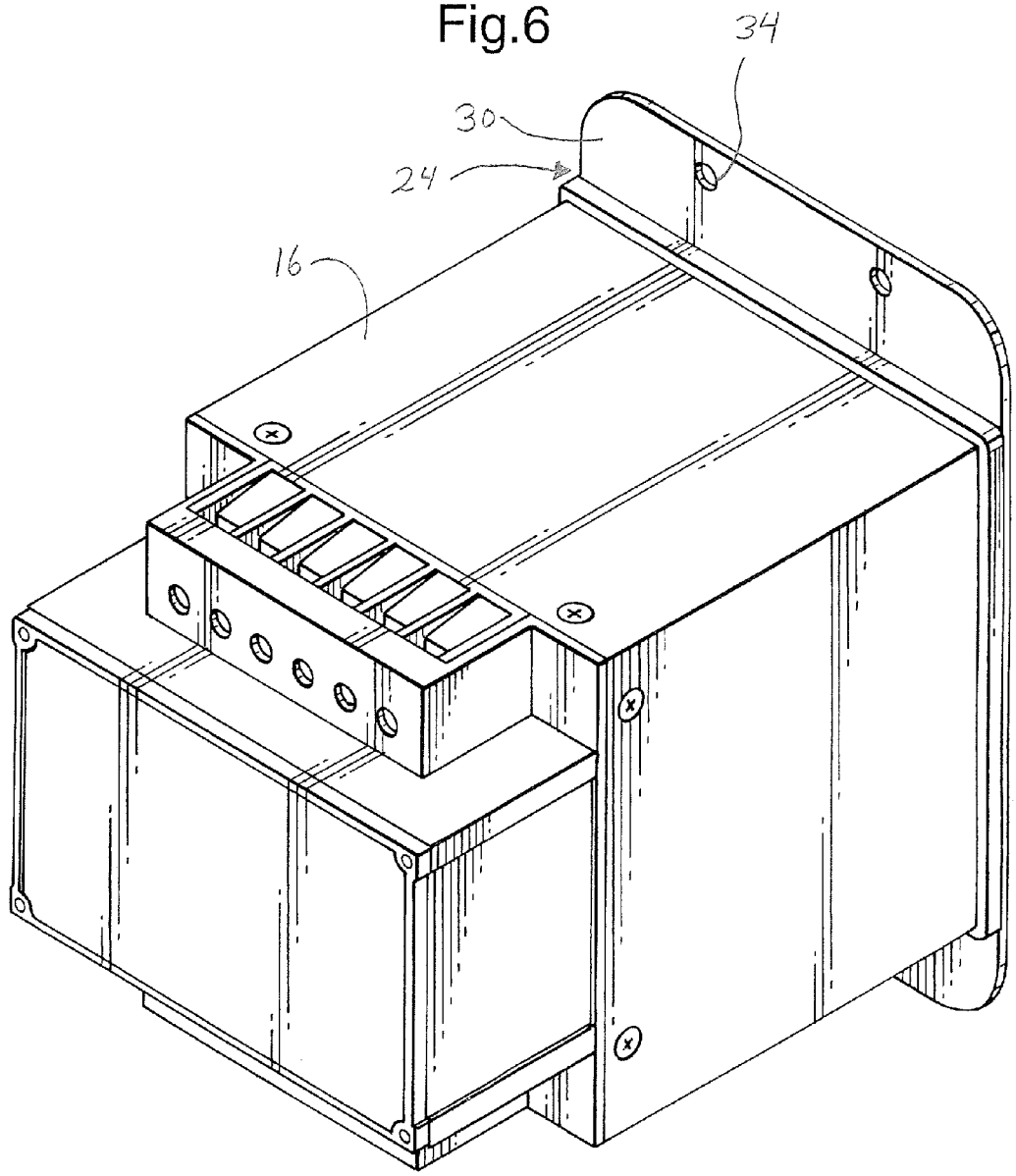
FIG. 6 is a perspective view of an enclosed electrical instrument with a housing having a closure and mounting member according to the arrangement of FIG. 5.

Referring to FIG. 6 which shows a side elevation of a surface mounting arrangement similar to that of FIG. 5 but with an integral closure arrangement 24 in which a single mounting plate is used for surface mounting the instrument to a wall or other surface. In this arrangement the closure member is substantially identical to the combined closure member 26 and mounting plate 30 but is integrally formed without the rail mounting features referred to in FIGS. 3 and 4.

Although the invention has been described with reference to embodiments shown in the accompanying drawings it is to be understood that the invention is not so limited to those precise embodiments and that various changes and modifications may be effected without further inventive skill and effort. For example, the interchangeable closure and mounting member may be provided with mounting featues for mounting arrangements other than surface and DIN rail mounting.

The invention claimed is:

1. An electrical meter or metering instrument assembly system comprising:
   a) an electrical meter or metering instrument with or without a readable display; and
   b) a modular housing system including:
      a housing enclosing the instrument, wherein the housing comprises an end opening configured to receive the instrument within the housing;
      a first end closure member and a second end closure member each configured to be interchangeably mounted on the housing to cover the end opening such that the first and second end closure members can be selectively alternatively mounted on the housing to cover the end opening;
      wherein the first end closure member includes a transparent display panel to permit viewing of a readable display of the instrument through the transparent display panel when the instrument in the housing has a readable display and the first end closure member is mounted on the housing and covering the end opening; and wherein the second end closure member includes a mounting plate adapted to mount the instrument with respect to a surface or a connector rail when the instrument is disposed in the housing and the second end closure member is mounted on the housing and covering the end opening.

2. The electrical meter or metering instrument assembly system as claimed in claim 1 wherein the instrument comprises at least one of an analogue or digital ammeter, voltmeter, wattmeter, varimeter, electrical energy usage meter including a kilowatt hour meter, an electronic meter relay, and phase sequence meter, and has a readable display or a communications link for remote reading of the instrument.

3. The electrical meter or metering instrument assembly system as claimed in claim 1 wherein the instrument includes a readable display and the first end closure member is mounted on the housing to cover the end opening such that the readable display is viewable through the transparent display panel.

4. A modular housing system comprising:

a housing configured to enclose a modular type electrical meter or metering type instrument, with or without a readable display, wherein the housing comprises an end opening configured to receive the instrument within the housing; and a first end closure member and a second end closure member each configured to be interchangeably mounted on the housing to cover the end opening such that the first and second end closure members can be selectively alternatively mounted on the housing to cover the end opening;

wherein the first end closure member includes a transparent display panel to permit viewing of a readable display of the instrument through the transparent display panel when the instrument is disposed in the housing, the instrument has a readable display, and the first end closure member is mounted on the housing and covering the end opening; and wherein the second end closure member includes a mounting plate adapted to mount the instrument with respect to a surface or a connector rail when the instrument is disposed in the housing and the second end closure member is mounted on the housing and covering the end opening.

5. The system of claim 4 wherein the second end closure member comprises a DIN rail connector.

6. The system of claim 5 further including a third end closure member comprising fastening means for fixing the third closure member directly to a surface on which the instrument is to be mounted or to a surface mounting plate for indirect attachment to the surface, wherein the third end closure member is configured to be interchangeably mounted on the housing to cover the end opening such that the first, second and third end closure members can be selectively alternatively mounted on the housing to cover the end opening.

7. The system of claim 5 including a surface mounting plate adapted to be connected to the second end closure member for mounting the instrument with respect to a surface.

8. The system of claim 5 wherein the second end closure member comprises an elongate channel for engagement with part of a DIN rail and latching means for releasably latching the housing to the DIN rail.

9. The system of claim 6 including connection means configured to provide interchangeable connection between the housing and each of the first end closure member, the second end closure member, and the third end closure member to enable a user to selectively alternatively cover the end opening with each of the first end closure member, the second end closure member, and third end closure member.

10. The system of claim 4 including connection means configured to provide interchangeable connection between the housing and each of the first end closure member and the second end closure member to enable a user to selectively alternatively cover the end opening with each of the first end closure member and the second end closure member.

11. The system of claim 10 wherein the connection means comprises a first connection means including an interlocking engagement means capable of fixing the second closure member to the housing.

12. The system of claim 11 wherein the interlocking engagement means comprises part of an interlocking resilient clip arrangement.

13. The system of claim 10 wherein the connection means includes first and second connection means forming parts of the second end closure member, and wherein:

the first connection means is configured to provide interchangeable connection between the housing and the second end closure member to enable a user to cover the end opening with the second end closure member; and the second connection means is configured for securing the second end closure member to a surface or connector rail.

14. The system of claim 13 wherein the first connection means is located on one side of the second end closure member and the second connection means is located on an opposing side of the second end closure member.

15. The system of claim 13 wherein the second connection means includes both a DIN rail connection means and a surface mounting connection means.

16. The system of claim 13 wherein the second end closure member comprises an end plate.

* * * * *